United States Patent [19]

Kwon et al.

[11] Patent Number: 5,034,958
[45] Date of Patent: Jul. 23, 1991

[54] FRONT-SURFACE EMITTING DIODE LASER

[75] Inventors: Young-Se Kwon, Seoul, Rep. of Korea; Hoi-Jun Yoo, Princeton, N.J.

[73] Assignee: Bell Communications Research, Inc., Livingston, N.J.

[21] Appl. No.: 510,960

[22] Filed: Apr. 19, 1990

[51] Int. Cl.$^5$ ............................................. H01S 3/19
[52] U.S. Cl. ........................................ 372/45; 372/46; 372/96; 357/4; 357/17
[58] Field of Search .................. 372/45, 43, 46, 96; 357/4, 17

[56] References Cited

U.S. PATENT DOCUMENTS 4,309,670 1/1982 Burnham et al. ...................... 372/46
4,949,350 8/1990 Jewell et al. ........................... 372/45

OTHER PUBLICATIONS

M. Ogura et al., "Surface-Emitting Laser Diode with Distributed Bragg Reflector and Buried Heterostructure," *Electronics Letters*, vol. 26, pp. 18–19, Jan. 4, 1990.

P. M. Asbeck et al., "GaAs/(Ga,Al)As Heterojunction Bipolar Transistors with Buried Oxygen-Implanted Isolation Layers," *IEEE Electron Device Letters*, Aug. 1984, vol. EDL-5, pp. 310–312.

K. Tai et al., "Use of Implant Isolation for Fabrication of Vertical Cavity Surface-Emitting Laser Diodes," *Electronics Letters*, vol. 25, Nov. 23, 1989, pp. 1644–1645.

K. Iga et al., "Surface Emitting Semiconductor Laser Array: Its Advantage and Future," *Journal Vacuum Science Technology*, A, vol. 7, May/Jun. 1989, pp. 842–846.

J. L. Jewell et al., "Low-Threshold Electrically Pumped Vertical-Cavity Surface-Emitting Microlasers," *Electronics Letters*, vol. 25, Aug. 17, 1989, pp. 1123–1124.

M. Orenstein et al., "Vertical Cavity Laser Arrays with Planar Lateral Confinement," *Postdeadline Papers, Optical Society of America*, 1989 Annual Meeting, Orlando, Fla., Oct. 15–20, 1989, p. 22.

*Primary Examiner*—Georgia Epps
*Attorney, Agent, or Firm*—James W. Falk; Charles S. Guenzer

[57] ABSTRACT

A front-surface emitting, vertical-cavity laser and its method of making in which a vertical laser cavity with Bragg reflectors and an active layer, preferably formed by a quantum well, is formed on a substrate. Lateral current confinement is achieved by implanting a conductivity-reducing ion into the region surrounding the quantum well. Electrical contact to the upper side of the active layer is achieved by implanting a conductivity-increasing ion into the region surrounding the cavity between the active layer and the upper reflector. By such an electrical contact, the upper reflector can advantageously be composed of dielectric layers. Light is then emitted through the upper reflector.

11 Claims, 4 Drawing Sheets

FRONT-SURFACE EMITTING DIODE LASER

FIELD OF THE INVENTION

The invention relates generally to lasers. In particular, the invention relates to surface-emitting diode lasers.

BACKGROUND OF THE INVENTION

Vertical-cavity, surface-emitting diode lasers offer many advantages. They may be integrated in a two-dimensional array on an opto-electronic chip. They may have diameters of the order of tens of micrometers or less so that large arrays occupy little space. Their quantum efficiency is fairly high. Nonetheless, the vertical-cavity, surface-emitting diode lasers proposed to date have several disadvantages. A recent review of progress in the field has been summarized by Iga et al in a technical article entitled "Surface emitting semiconductor laser array: Its advantage and future", appearing in Journal Vacuum Science Technology A, volume 7, 1989 at pages 842–846.

Many of the proposals involve growing a vertical laser structure of III-V materials on a GaAs substrate. This structure includes some lateral definition of the active region or current injection means into the active region. Then, the substrate is locally thinned by etching from beneath in the area of the laser structure so as to expose the laser structure in a back-surface via hole bored into the substrate. A partially transmitting metallic or dielectric stack mirror, forming one side of the Fabry-Perot cavity of the laser, is then deposited on the back surface of the laser structure exposed in the hole. The laser light is emitted from the bottom of the chip, through the hole bored into the substrate.

The process of boring a hole through the back of the substrate suffers many disadvantages, such as the critical stopping of the back-side etching at the back mirror surface and the front-to-back alignment. Generally, such back-side processing is difficult and considered undesirable for production lasers.

Jewell et al have disclosed another structure for vertical-cavity, surface-emitting lasers in U.S. patent application, Ser. No. 07/380,996, filed July 17, 1989, now issued as U.S. Pat. No. 4,949,350 and in a technical article entitled "Low-threshold electrically pumped vertical-cavity surface-emitting microlasers", appearing in Electronics Letters, volume 25, 1989 at pages 1123–1124. They grew a laterally undefined, vertical-cavity laser structure on a conducting GaAs substrate. The structure included semiconductor Bragg reflectors on both ends of the cavity. The active layer contained strained quantum wells of InGaAs. Lateral definition was achieved by chemically assisted, ion-beam etching which produced precisely vertical pillars ~5 μm in height and 2 μm or more in diameter. Each pillar was a laser. Contact was made to the top of each pillar, the conducting substrate serving as the other electrode. Laser light was emitted through the GaAs substrate which passed the 950 nm light emitted by the InGaAs.

The Jewell et al laser structure presents several difficulties. Providing permanent leads to the tops of the pillars is difficult. The current passes through both Bragg reflectors. Therefore, the Bragg reflectors were made of semiconductor materials rather than of a combination of insulators, which is well known to be more efficient. The semiconductor Bragg reflectors were made of alternating layers of GaAs and AlAs, which have a relatively small difference of refractive indices, $\Delta n \approx 0.62$. Thus, many layers were required for high mirror reflectance. Nonetheless, there was a semiconductor heterojunction at each interface. To reduce the junction resistance in order to achieve a high quantum efficiency, a graded superlattice of GaAlAs was provided between the GaAs and AlAs layers of the Bragg reflector. For these reasons, they grew a laser structure including over 500 layers. Clearly, it would be desirable to reduce the number of layers. Further, the Jewell et al laser emitted from the unpatterned back surface of the substrate. It is preferable in many applications that the light be emitted from the patterned front surface. In particular, GaAs has a band-edge at ~870 nm, near and below which it will not transmit. Thus, GaAs cannot be used as a substrate for a back-surface emitting laser diode emitting at this wavelength or in the visible below ~700 nm unless a hole is bored in the substrate. Yet further, Jewell et al used a conducting substrate to provide the back contact. If their laser diode is to be integrated with other electrical components on a common substrate, electrical isolation cannot rely simply on lateral displacement on such a conducting substrate.

Orenstein et al have proposed another surface-emitting, vertical-cavity diode laser in U.S. patent application, Ser. No. 07/480,117, filed Feb. 14, 1990 and in a post-deadline technical paper entitled "Vertical cavity laser arrays with planar lateral confinement" appearing in Postdeadline Papers, Optical Society of America, 1989 Annual Meeting, Orlando, Fla., Oct. 15–20, 1989 at page PD22. Their vertical laser structure was the same as for Jewell et al. However, Orenstein et al did not etch pillars but instead implanted resistance-increasing protons into the upper Bragg reflector surrounding the intended lasers. Thereby, they avoided the problem of contacting the high aspect-ratio pillars. Although, the Orenstein et al laser offers some advantages over that of Jewell et al in some applications, it still suffers the disadvantages of back-surface emission and a large number of layers.

Ogura et al have disclosed a front-surface emitting laser in a technical article entitled "Surface-emitting laser diode with distributed Bragg reflector and buried heterostructure" appearing in Electronics Letters, volume 26, 1990 at pages 18–19. They deposited a semiconductor lower Bragg reflector, lower spacer, active region and upper spacer. Then they etched a pillar similarly to Jewell et al. Thereafter, they regrew semiconductor material surrounding the pillar which current isolated the active region and below but which provided a lateral current contact to the upper spacer. Thereafter, they deposited a Si/SiO$_2$ dielectric stack over the pillar for the upper mirror. Etching the pillar is believed to introduce surface states. The threshold current reported by Ogura et al is considered excessive.

SUMMARY OF THE INVENTION

Accordingly, it is an object of the invention to provide a front-surface emitting diode laser.

It is another object of the invention to provide a vertical-cavity, surface-emitting laser in which at least one of the Bragg reflectors is made of insulating (dielectric) material.

It is a further object of the invention to provide a vertical-cavity, surface-emitting diode laser fabricated on a GaAs substrate that emits in the visible.

A still further object of the invention is to provide a surface-emitting laser diode which can be easily integrated with other components on an opto-electronic integrated circuit. The invention can be summarized as a front-surface emitting laser in which a lower laser cavity structure is epitaxially formed on a conducting crystalline substrate. This structure is a semiconductor Bragg reflector, a lower spacer, an active region including quantum wells, and an upper spacer. A dielectric or semiconductor Bragg reflector is then formed and patterned with a photoresist mask. This mask is then used for two ion implantations. One implantation is of an ion that reduces conductivity and is a deep implantation so as to channel current through the lower portions of the upper spacer and the active region. The other implantation is of an ion that increases conductivity and is shallow so as to provide a lateral contact to upper portions of the upper spacer. Light emission is through the upper or dielectric Bragg reflector.

DETAILED DESCRIPTION

A first embodiment of the invention was tested in which a double ion-implantation with a single mask provided both a surface contact to the lateral side of the upper cavity and current isolation through the active region.

Figure 1:
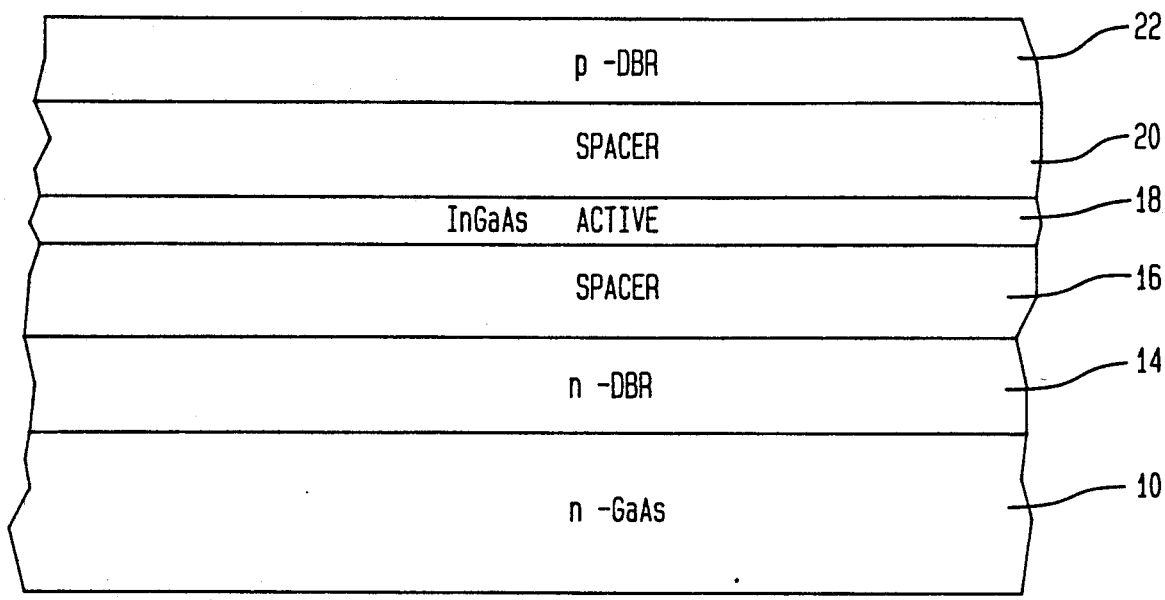
FIG. 1 is a cross-section of an unpatterned structure grown in one step of fabrication of an embodiment of the invention.

As illustrated in cross-section in FIG. 1, an n-type GaAs substrate 10 having a (001) orientation was cleaned and then inserted into an Varian GEN-II molecular beam epitaxy (MBE) growth system. There was grown an unillustrated 0.5 $\mu$m thick n-type GaAs buffer layer. This and all subsequent layers labeled n-type were doped $5 \times 10^{18}$cm$^{-3}$ with silicon.

A n-type, lower distributed Bragg reflector 14 was then grown on the buffer layer. The lower part of the lower reflector 14 was a superlattice and an 80.2 nm thick n-type AlAs layer. The superlattice was a four layer structure of AlAs, GaAs, AlAs and GaAs, the layers each being 1 nm thick, n-type and being grown in the stated order. The remainder of the lower reflector 14 consisted of 24 periods of a lower, n-type GaAs layer of 65 nm thickness, a superlattice as described above, and an upper, n-type AlAs layer of 78.2 nm thickness. The superlattices were included in order to reduce the series resistance. The thicknesses of the AlAs and GaAs layers, combined with a portion of the superlattice, each corresponded to an optical length $\lambda/4$, where $\lambda$ is the intended lasing frequency, when the refractive index n of the respective layer is included in the optical length.

On the lower reflector 14, there was grown a lower spacer 16. The lower spacer was formed by a lower layer of n-type Al$_{0.5}$Ga$_{0.5}$As of 85 nm thickness and an upper, undoped, graded layer of 20 nm thickness. The graded layer was linearly graded from Al$_{0.5}$Ga$_{0.5}$As at the bottom to GaAs at the top.

An undoped active region 18 was grown on the lower spacer 16. The active region 18 consisted of four 8 nm thick strained quantum well layers of In$_{0.2}$Ga$_{0.8}$As sandwiched between five 10 nm thick GaAs layers. The strained quantum well layers had a thickness and composition corresponding to an emission frequency $\lambda_g = 0.98$ $\mu$m.

An upper spacer 20 was grown on the active region 18. Similarly to the lower spacer 16, it consisted of a lower, undoped, graded region of 20 nm thickness graded from GaAs to Al$_{0.5}$Ga$_{0.5}$As and an upper p-type Al$_{0.5}$Ga$_{0.5}$As layer of 85 nm thickness. By p-type is meant having a dopant concentration of beryllium of $5 \times 10^{18}$cm$^{-3}$.

The outer edges of the two spacers 16 and 20 defined a vertical optical cavity having an optical length of $\lambda/2$, where $\lambda = 971$ nm.

On the upper spacer 20, there was grown a p-type upper Bragg reflector 22 consisting of 20 periods of a lower layer of AlAs of 80.2 nm thickness and an upper layer of GaAs of 67 nm thickness. At this high p-type doping level, the semiconductor reflector 22 was degenerate so that the superlattices of Jewell et al would not help to reduce the series resistance. The upper, semiconductor Bragg reflector 22 was not required for the present invention but was included to provide a ready comparison with the laser structure of Jewell et al. For this same reason, there was grown on the upper Bragg reflector 22 a 32 nm thick p-type AlAs layer and a 3 nm thick $\delta$-doped layer of GaAs, both unillustrated.

Figure 2:
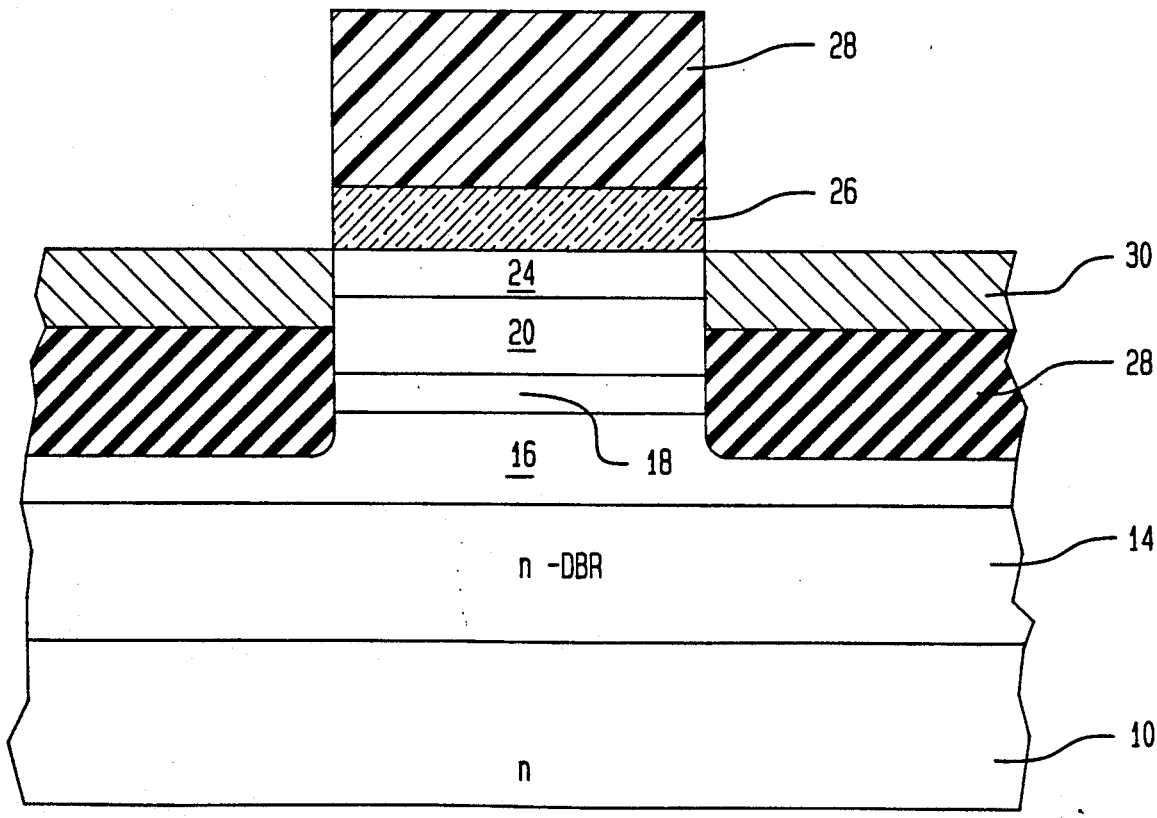
FIG. 2 is a cross-section of another step in the fabrication of the embodiment of FIG. 1.

Then, the area of the substrate 10 intended for an array of the lasers of the invention was ion-beam milled with Ar ions of 0.5 keV followed by etching with H$_3$PO$_4$:H$_2$O$_2$:CH$_3$OH (1:1:3 by volume). The milling and etching removed material to within $\sim 0.4$ $\mu$m of the upper edge of the upper spacer 20, as illustrated in the center of FIG. 2, so as to consume part of the upper Bragg reflector 22 but leaving one or two periods of the GaAs/AlAs structure in a truncated semiconductor Bragg reflector 24. The etching was controlled by frequently measuring the etched step with a Dek-tak profiler. If the etching rate of the ion beam is known, it would be preferred to etch only with the ion beam.

On this newly etched surface, a 0.4 $\mu$m thick SiO$_2$ layer 26 was grown by plasma-enhanced chemical vapor deposition. Then a 1.4 $\mu$m thick layer 28 of photoresist was deposited and photolithographically patterned into the intended shape of the laser, specifically a circular area of 25 $\mu$m diameter. The SiO$_2$ layer 26 exposed by the developed photoresist layer 28 was etched away with a buffered HF oxide etchant.

Thereafter, two ion-implantations were performed using the SiO$_2$ layer 26 and photoresist layer 28 as a common mask. A first implantation of O$^+$ of 400 keV to a dose of $1 \times 10^{15}$cm$^{-2}$ produced a buried high-resistance region 28. A second implantation of Be$^+$ of 200 keV to a dose of $1 \times 10^{15}$cm$^{-2}$ produced a conductive surface region 30 that extends down to the sides of the upper spacer 20. Asbeck et al disclose a related oxygen/beryllium implantation in a technical article entitled "GaAs/(Ga,Al)As Heterojunction Bipolar Transistors with Buried Oxygen-Implanted Isolation Layers" appearing in IEEE Electron Device Letters, volume EDL-5, 1984 at pages 310-312. Both implantations were performed at a tilt of 7°.

The implanted structure was encapsulated with plasma-deposited $Si_3N_4$ and subjected to a rapid thermal annealing at 850° C. for 20 sec in an flowing argon atmosphere. After the annealing, the lasers in the array were isolated from each other by a photolithographically defined etch with $H_3PO_4:H_2O_2:CH_3OH$(1:1:3, by volume) through the Be-implanted, conductive layer 30 to produce a reduced-area conductive layer 32 illustrated in FIG. 3. In another photolithographic step, a ring-shaped trench was formed in a photoresist layer. The trench was centered around the 25 μm $SiO_2$ dot 26, was located above the reduced-area conductive layer 32 and had an inner diameter of 25 μm and an outer diameter of 75 μm. Electron evaporation was used to deposit an alloy structure of 50 nm of Cr, 150 nm of AuBe and 200 nm of Au. The deposited layers outside of the trench were lifted off with the photoresist, leaving an alloy ring 34 contacting the conductive layer 32. The alloy ring 34 was alloy annealed by rapid thermal annealing for 10 sec at 400° C. to provide a p-electrode for the laser.

Thereafter, the laser array area was coated with photoresist and patterned to leave exposed the top of the $SiO_2$ dots 26. Then, three periods of 65 nm of Si and 145.7 nm of $Al_2O_3$ were deposited by e-beam evaporation. Each of these layers had an optical thickness of $\lambda/4$. The deposited material above the remaining photoresist was lifted off leaving an upper dielectric distributed Bragg reflector 36 of three Si layers 38 and three $Al_2O_3$ layers 40. Taking into account the refractive indices of 3.42 for semiconducting Si and of 1.7 for dielectric $Al_2O_3$, each of the layers 38 and 40 had an optical thickness of $\lambda/4$. Because of the large value of $\Delta n = 1.72$, relatively few periods were required for an efficient Bragg reflector.

The back side of the wafer was then lapped to ~100 μm thickness and polished with a 2% brominated methanol solution. The resulting back side mirror surface was then coated with an n-electrode 42 consisting of a 100 nm layer of AuGe, a 40 nm layer of Ni and a 350 nm layer of Au. This thick and unpatterned n-electrode 42, allowed since light was emitted from the front side, further aided thermal dissipation. In an operational devices, leads 44 and 46 of, for example, gold wires would be bonded to the p-electrode 34 and the n-electrode 42.

Figure 3:
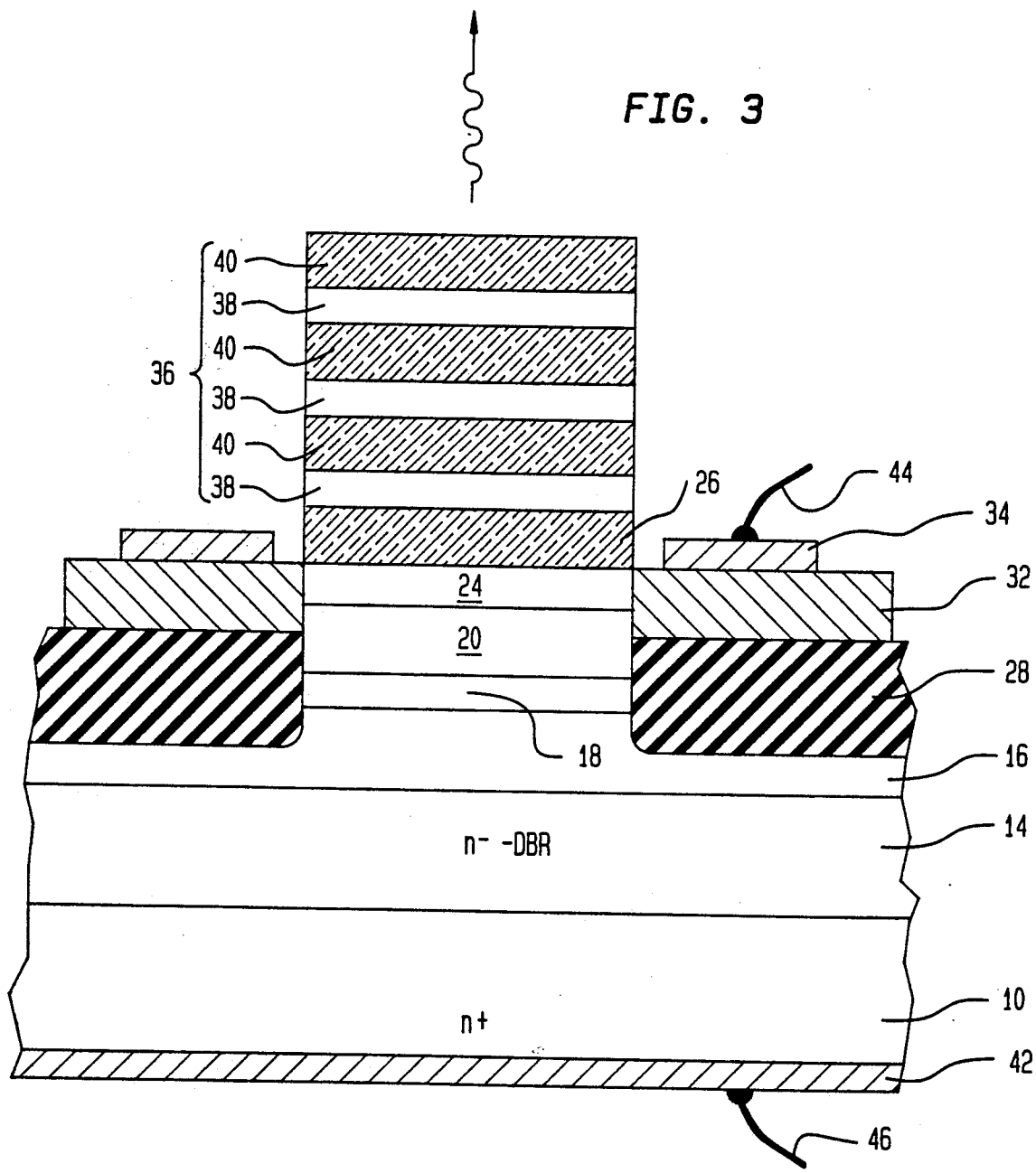
FIG. 3 is a cross-section of the fabricated laser of FIGS. 1 and 2.

In testing the laser of FIG. 3, electrical power was applied between the n-electrode and the p-electrode. When tested at room temperature using 40 nsec pulses at a 5 kHz repetition rate, typical lasing threshold currents for a 25 μm front-surface emitting laser of the invention were 6 mA. Above threshold, the lasing wavelength $\lambda$ was 971 nm with a spectral linewidth of 0.5 nm. The forward current vs. voltage characteristics showed a relatively low series resistance, for example, 3 V at 4 mA.

Part of the same wafer was processed to provide back-surface emitting lasers of structure similar to that of Jewell et al. That is, the p-type distributed Bragg reflector layer 22 was used as the upper reflector and all electrical current passed through it. These double semiconductor-mirror lasers showed a typical threshold current of 15 mA and a higher series resistance, for example, 8 V at 4 mA.

Thus the absence of the high resistance, p-doped upper reflector in the laser of FIG. 3 provides the lower series resistance and higher efficiency. Furthermore, current confinement is achieved without introducing a surface interface. A further advantage of the front-surface emitting structure of FIG. 3 is that light is not emitted through a GaAs substrate. Therefore, the laser structure epitaxially grown on GaAs can be designed to emit and resonate light at a wavelength below the absorption edge of GaAs, perhaps even at visible wavelengths.

The structure described above can be further improved. The p-type upper reflector layer 22 was included primarily for comparison purposes. Its required etching subsequently introduces phase discontinuities and thus inefficiency at the interface between the AlAs/GaAs part and the dielectric part of the upper reflector. Furthermore, the $SiO_2$ layer 26 is an artifact of the processing. It would be preferred that the dielectric mirror 36 be grown directly on the upper spacer 20.

Figure 4:
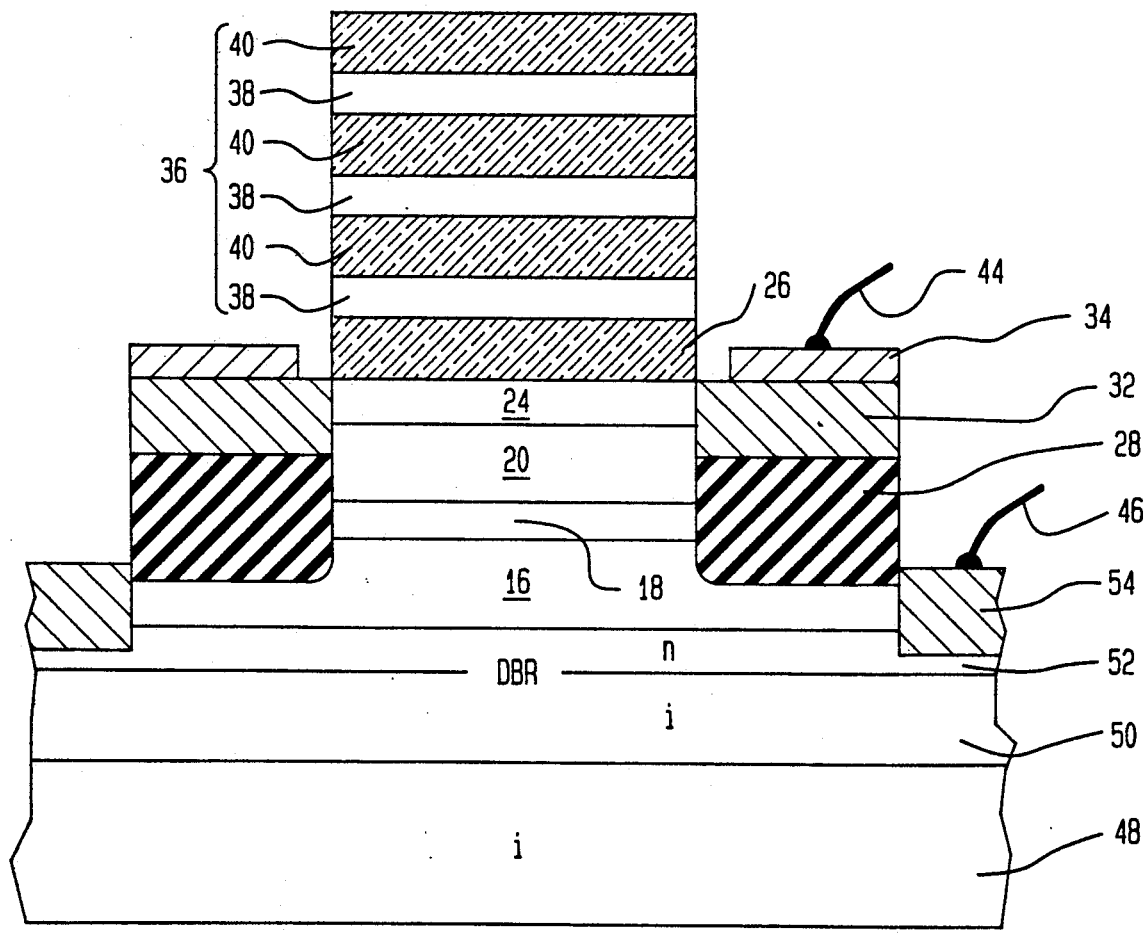
FIG. 4 is a cross-section of another embodiment of a laser of the invention having both its electrodes on the front surface.

A variant of the laser diode of FIG. 3 allows contacting to the front side for both of the electrodes. As illustrated in FIG. 4, a semi-insulating GaAs substrate 48 is used. The lower, semiconductor distributed Bragg reflector is divided into a lower, insulating (undoped) portion 50 and an upper n-type portion 52 consisting of a few periods of AlAs/GaAs. When the isolation etching is performed, it etches down to the n-type portion 52 of the lower DBR. A metallization 54 is deposited on the n-type portion 52 of the lower DBR and contacts the lower spacer 16 so as to serve as the n-electrode. It may be isolated for each laser.

The laser of FIG. 4 offers several advantages. The low conductivity of the substrate 48 and the insulating portion 50 of the lower DBR reduces capacitance. The insulating substrate allows for easy isolation of other electronic devices, such as a HEMT (high electron mobility transistor), MESFET or HBT (heterojunction bipolar transistor), or optical devices, such as a photo-detector, on the same substrate 48. Contacting is performed at the front surface and is amenable to individual or matrix addressing of arrays. The height differences are relatively small. In the embodiment of FIG. 4, the Si/$Al_2O_3$ stack is 0.6 μm high and the isolation etch is 0.4 μm deep.

Figure 5:
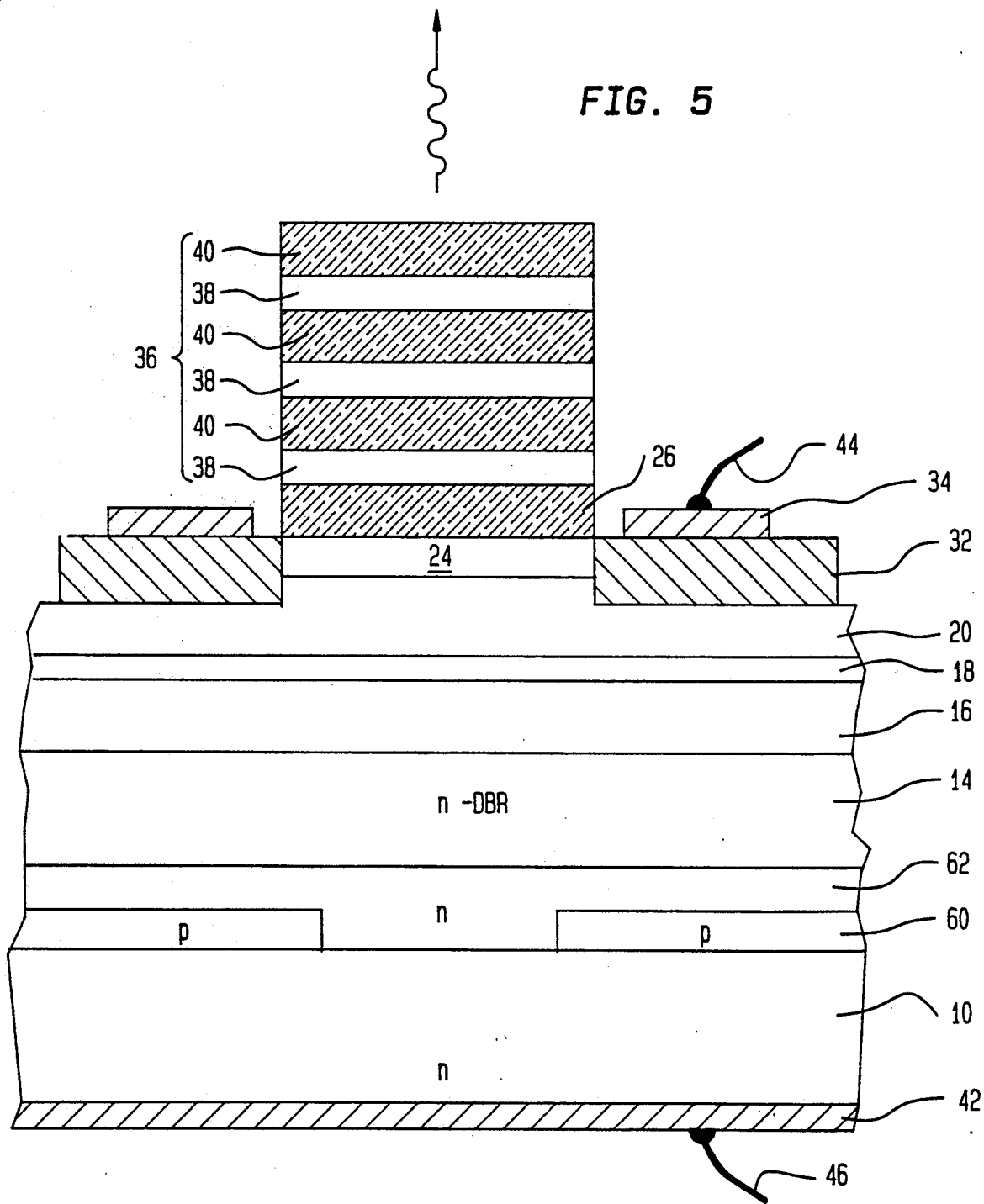
FIG. 5 is a cross-section of yet another embodiment of a laser of the invention providing current confinement with a buried junction.

Another front surface emitting diode laser is illustrated in cross section in FIG. 5. It accomplishes current confinement by a buried p-n junction. On the buffer layer of the n-type substrate 10, there is grown a p-type layer 60 of GaAs which is patterned with an aperture below the intended laser. In an epitaxial regrowth process, an n-type layer 62 of GaAs is grown in the aperture and over the p-type layer 60. Thereafter, the fabrication procedure follows that described for the laser diode of FIG. 3. However, there is no oxygen implantation because the required current confinement is provided by the p-n junction between the p-type layer 60 and the n-type layer 62 and substrate 10. Alternatively, the p-type layer 60 may be grown over the lower DBR layer 14 and thereafter patterned, thus providing the current confinement.

Although the above embodiments have relied on an upper dielectric distributed Bragg reflector, the invention includes all-semiconductor reflectors and all combinations of two materials of differing refractive indices, whether semiconductive, metallic or dielectric.

All these front surface emitting lasers provide the advantages of shorter Bragg reflectors on the upper surface, thus a more planar surface, ease of contacting the upper electrode, and easier optical alignment to visible features. Furthermore, series resistance can be reduced without a compromise in optical absorption.

What is claimed is:

1. A surface-emitting laser, comprising:
a semiconductor, crystalline substrate;
a lower, semiconductor Bragg reflector epitaxially formed vertically over said substrate;
a lower, semiconductor spacer epitaxially formed over said lower reflector;
an active layer epitaxially formed over said lower spacer for emitting light at a wavelength;
an upper spacer, comprising a semiconductor, formed over said active layer;
an upper Bragg reflector formed over said upper spacer and comprising at least two layers having optical thicknesses related to said wavelength, an optical cavity having an optical length related to said wavelength being formed between said upper and lower reflectors, a laser structure being formed comprising said reflectors, said spacers, and said active layer;
a first electrode electrically connected horizontally to a first horizontally central part of said laser structure in a contacting region disposed above said active layer and below a top of said upper reflector; and
a current confining region formed horizontally outward from a second horizontally central part of said laser structure by first ions implanted into said laser structure below said contacting region, said first ions decreasing conductivity in said current confining region.

2. A laser as recited in claim 1, wherein said active layer comprises at least one quantum well layer.

3. A laser as recited in claim 2, wherein said second central part of said laser structure includes said quantum well layer.

4. A laser as recited in claim 1, wherein said at least two layers of said upper reflector include at least one dielectric layer.

5. A laser as recited in claim 1, further comprising a conducting region to which said first electrode is connected and formed horizontally outward from said first central part of said laser structure by implanted second ions, said second ions increasing conductivity in said conducting region.

6. A laser as recited in claim 5, wherein said active layer comprises at least one quantum well layer;
wherein said current confining region surrounds said quantum well layer; and
wherein said upper reflector comprises a plurality of periods of said two layers, at least one of said two layers comprising a dielectric.

7. A laser as recited in claim 6, further comprising a second electrode electrically connected to a bottom of said substrate.

8. A laser as recited in claim 6, further comprising a second electrode electrically connected to said laser structure vertically above said substrate, said first and second electrodes providing a vertical current path through said second central part of said laser structure.

9. A laser as recited in claim 8, wherein said lower reflector comprises an upper portion of a higher conductivity to which said second electrode is connected and a lower portion of a lower conductivity.

10. A surface-emitting laser, comprising:
a semiconductor, crystalline body of a first conductivity type;
a semiconductor bottom layer of a second conductivity type epitaxially formed vertically over said crystalline body and having an aperture therethrough;
a semiconductor aperture layer of said first conductivity type epitaxially formed over said crystalline body within said aperture and over said bottom layer;
a lower, semiconductor Bragg reflector of said first conductivity type epitaxially formed vertically over said aperture layer;
a lower, semiconductor spacer of said first conductivity type epitaxially formed over said lower reflector;
an active layer epitaxially formed over said lower spacer for emitting light at a wavelength;
an upper spacer, comprising a semiconductor of said second conductivity type, formed over said active layer;
an upper Bragg reflector formed over said upper spacer and comprising at least two layers having optical thickness related to said wavelength, an optical cavity having an optical length related to said wavelength being formed between said upper and lower reflectors, a laser structure being formed comprising said reflectors, said spacers, and said active layer;
a first electrode electrically connected horizontally to a first horizontally central part of said laser structure in a contacting region disposed above said active layer and below said at least two layers; and
a second electrode electrically connected to said crystalline body.

11. A laser as recited in claim 10, wherein said at least two layers of said upper reflector include at least one dielectric layer.

* * * * *

UNITED STATES PATENT AND TRADEMARK OFFICE
CERTIFICATE OF CORRECTION

PATENT NO. : 5,034,958

DATED : July 23, 1991

INVENTOR(S) : Young-Se Kwon and Hoi-Jun Yoo

It is certified that error appears in the above-identified patent and that said Letters Patent is hereby corrected as shown below:

Column 8, line 37, "thickness" should read --thicknesses--.

Signed and Sealed this

Twenty-ninth Day of December, 1992

*Attest:*

DOUGLAS B. COMER

*Attesting Officer*      *Acting Commissioner of Patents and Trademarks*